US006251801B1

United States Patent
Saki et al.

(10) Patent No.: US 6,251,801 B1
(45) Date of Patent: Jun. 26, 2001

(54) METHOD AND APPARATUS FOR MANUFACTURING SEMICONDUCTOR DEVICE

(75) Inventors: Kazuo Saki; Shuji Katsui, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/413,541

(22) Filed: Oct. 6, 1999

(30) Foreign Application Priority Data

Oct. 7, 1998 (JP) .................................................. 10-285209

(51) Int. Cl.[7] .......................... H01L 21/31; H01L 21/469
(52) U.S. Cl. .......................... 438/769; 438/775; 438/776; 438/791; 438/792
(58) Field of Search ..................................... 438/769, 775, 438/776, 791, 792

(56) References Cited

U.S. PATENT DOCUMENTS 5,782,979 * 7/1998 Kaneno et al. ....................... 118/500
6,130,118 * 10/2000 Yamazaki ............................. 438/151
6,184,068 * 2/2001 Ohtani et al. ........................ 438/151

* cited by examiner

*Primary Examiner*—Richard Booth
*Assistant Examiner*—Alexander G. Ghyka
(74) *Attorney, Agent, or Firm*—Finnegan, Henderson, Farabow, Garrett & Dunner, L.L.P.

(57) ABSTRACT

Disclosed is a method of manufacturing a semiconductor device, including the step of supplying an oxidizing gas and a nitriding gas onto one main surface of a semiconductor substrate while heating the substrate so as to oxynitride the surface region of the substrate, wherein the supplying step is performed such that the gaseous phase above the main surface of the substrate forms a first region having a substantially uniform temperature in a direction perpendicular to the main surface of the substrate and a second region interposed between the first region and the substrate and having a temperature gradient in a direction perpendicular to the main surface of the substrate such that the temperature is elevated toward the substrate, and the distance from the main surface of the substrate to the interface between the first and second regions is set at 9.5 cm or less.

12 Claims, 5 Drawing Sheets

METHOD AND APPARATUS FOR MANUFACTURING SEMICONDUCTOR DEVICE

BACKGROUND OF THE INVENTION

The present invention relates to a method of manufacturing a semiconductor device and an apparatus for manufacturing a semiconductor device, particularly, to a method and apparatus for forming, for example, a gate insulating film included in a MOS transistor.

A magnetic disk memory device is widely used as a memory device included in an information processing apparatus. However, the magnetic disk memory device requires a highly precise mechanical driving mechanism and, thus, is weak against impact. Further, in the magnetic disk memory device, a magnetic head or a memory medium must be mechanically operated in recording information onto the memory medium or in reading information from the memory medium. As a result, it is impossible to achieve a high speed access in the magnetic disk memory device.

On the other hand, a semiconductor memory device does not include a portion that must be mechanically driven. Therefore, the semiconductor memory device is strong against impact and a high speed access can be achieved. Such being the situation, demands for a semiconductor memory device are on a sharp increase in recent years, and vigorous researches are being made on the semiconductor memory device.

The research and development of the semiconductor memory device are being directed mainly to miniaturization of the memory cell by making progress in the fine processing technology. Specifically, it is intended to improve the memory capacity, etc. by proportionally diminishing the memory cell. Naturally, the miniaturization of the memory cell necessitates reduction in the thickness of the gate insulating film. However, reduction in the thickness of the gate insulation film gives rise to problems relating to reliability of the gate insulating film and to performance of the transistor.

For example, in a nonvolatile memory in which a memory cell is formed of a transistor having a thin gate insulating film through which flows a tunnel current, i.e., a tunnel insulating film, the thickness of the tunnel insulating film tends to be decreased in accordance with improvement in the degree of integration.

However, with decease in the thickness of the tunnel insulating film, since a high electric field stress is applied to the tunnel insulating film, a serious problem is brought about that a leak current flowing in a region of a low electric field, i.e., a stress leak current, is increased. Also worried about is, for example, the lowering of $Q_{bd}$ characteristics, i.e., increase in the trapped electrons and decrease in the amount of charge that can be allowed to flow through the insulating film.

For overcoming the above-noted problems, a silicon oxynitride film is used as the tunnel insulating film in place of a silicon oxide film. The silicon oxynitride film differs from the silicon oxide film in that a weak Si—O bond is modified by a nitrogen atom. Therefore, the use of an oxynitride film as a tunnel insulating film is considered to be effective for suppressing the generation of the electron trapping caused by the application of a high electric field stress and for suppressing an increase in the stress current. However, satisfactory characteristics cannot be obtained in the case of using the oxynitride film formed by the conventional method.

For example, the oxynitride film used as the tunnel insulating film can be formed by forming first a silicon oxide film on a surface of a silicon wafer, followed by nitriding the silicon oxide film by using an ammonia ($NH_3$) gas and subsequently annealing the film by using an oxygen gas. This method makes it possible to introduce nitrogen atoms that are important for enhancing the reliability of the oxynitride film into the entire region of the film with a high concentration.

In this method, however, hydrogen is also introduced into the film during the nitriding process for introducing nitrogen atoms into the film. Although, the introduced hydrogen atoms are mostly liberated during the subsequent oxidizing process, some of the hydrogen atoms remain unremoved within the film. The hydrogen atoms remaining within the film bring about insulation breakdown, formation of electron trap, and increase in the stress leak current. Such being the situation, it is desirable to employ a process for forming an oxynitride film under a hydrogen-free condition in place the process using an ammonia gas.

A process using an $N_2O$ gas and a process using both an NO gas and an $O_2$ gas are known to the art as a process for forming an oxynitride film under a hydrogen-free condition. In the process using an $N_2O$ gas, an $N_2O$ gas is supplied onto a surface of a silicon wafer heated to, for example, about 950° C. The $N_2O$ gas arriving at a region in the vicinity of the wafer surface is heated so as to be decomposed into a nitrogen gas ($N_2$), an oxygen gas ($O_2$) and nitrogen monoxide gas (NO). Where the wafer temperature is set at, for example, 950° C., the $N_2O$ gas is decomposed into 64.3% of $N_2$ gas, 31.3% of $O_2$ gas and 4.7% of NO gas. In this process, the oxidizing species of $O_2$ and the nitriding species of NO, which are generated by the thermal decomposition of $N_2O$, are involved in the formation of an oxynitride film. In this method, however, the nitriding species of NO gas is formed only slightly, resulting in failure to introduce a sufficiently large amount of nitrogen atoms into the film.

On the other hand, in the process using an NO gas and an $O_2$ gas, the NO gas and the $O_2$ gas are supplied onto a heated surface of the wafer so as to form an oxynitride film. In this method, it is considered possible to supply a sufficiently large amount of an NO gas unlike the process using an $N_2O$ gas. In fact, however, a gaseous phase reaction given below takes place before the NO gas and the $O_2$ gas arrive at the wafer surface:

$$2NO+O_2 \rightarrow 2NO_2$$

As a result, a large proportion of the NO gas is consumed for formation of the $NO_2$ gas that is not involved in the nitriding reaction on the surface of the wafer, leading to a low NO concentration in the vicinity of the wafer surface. It follows that it is difficult to increase the nitrogen concentration in the film in the known process using $N_2O$ gas or both NO gas and $O_2$ gas.

BRIEF SUMMARY OF THE INVENTION

An object of the present invention is to provide a method of manufacturing a semiconductor device including an oxynitride film containing nitrogen in a high concentration and an apparatus for manufacturing such a semiconductor device.

Another object of the present invention is to provide a method of manufacturing a semiconductor device including an oxynitride film having a sufficiently uniform nitrogen concentration and an apparatus for manufacturing such a semiconductor device.

Further, still another object of the present invention is to provide a method of manufacturing a semiconductor device including a gate insulating film excellent in electric characteristics and an apparatus for manufacturing such a semiconductor device.

According to an aspect of the present invention, there is provided a method of manufacturing a semiconductor device, comprising the step of supplying an oxidizing gas and a nitriding gas onto one main surface of a semiconductor substrate while heating the substrate so as to oxynitride the surface region of the substrate, wherein the supplying step is performed such that the gaseous phase above the main surface of the substrate forms a first region having a substantially uniform temperature in a direction perpendicular to the main surface of the substrate and a second region interposed between the first region and the substrate and having a temperature gradient in a direction perpendicular to the main surface of the substrate such that the temperature is elevated toward the substrate, the distance from the main surface of the substrate to the interface between the first and second regions being set at 9.5 cm or less.

According to another aspect of the present invention, there is provided a method of manufacturing a semiconductor device, comprising the step of supplying an oxidizing gas and a nitriding gas onto one main surface of a semiconductor substrate while heating the substrate so as to oxynitride the surface region of the substrate, wherein the supplying step is performed such that the temperature of the gaseous phase above the main surface of the substrate is set at 900° C. or less at a point 1.5 cm away from the main surface of the substrate.

According to another aspect of the present invention, there is provided an apparatus for manufacturing a semiconductor device, comprising a process vessel having a process chamber formed therein, an inlet port, and an outlet port positioned below the inlet port; a holder rotatably arranged within the process vessel for holding a target substrate to be treated; a light source arranged to face the target substrate held by the holder for irradiating the substrate with light for heating the substrate; and a shower head for supplying substantially uniformly a gas introduced through the inlet port onto one surface of the target substrate.

Further, according to still another aspect of the present invention, there is provided an apparatus for manufacturing a semiconductor device, comprising a process vessel having a process chamber formed therein, an inlet port, and an outlet port positioned substantially flush with the inlet port; a holder arranged within the process vessel for holding a target substrate to be treated; and a light source arranged to face the target substrate held by the holder for irradiating the substrate with light for heating the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
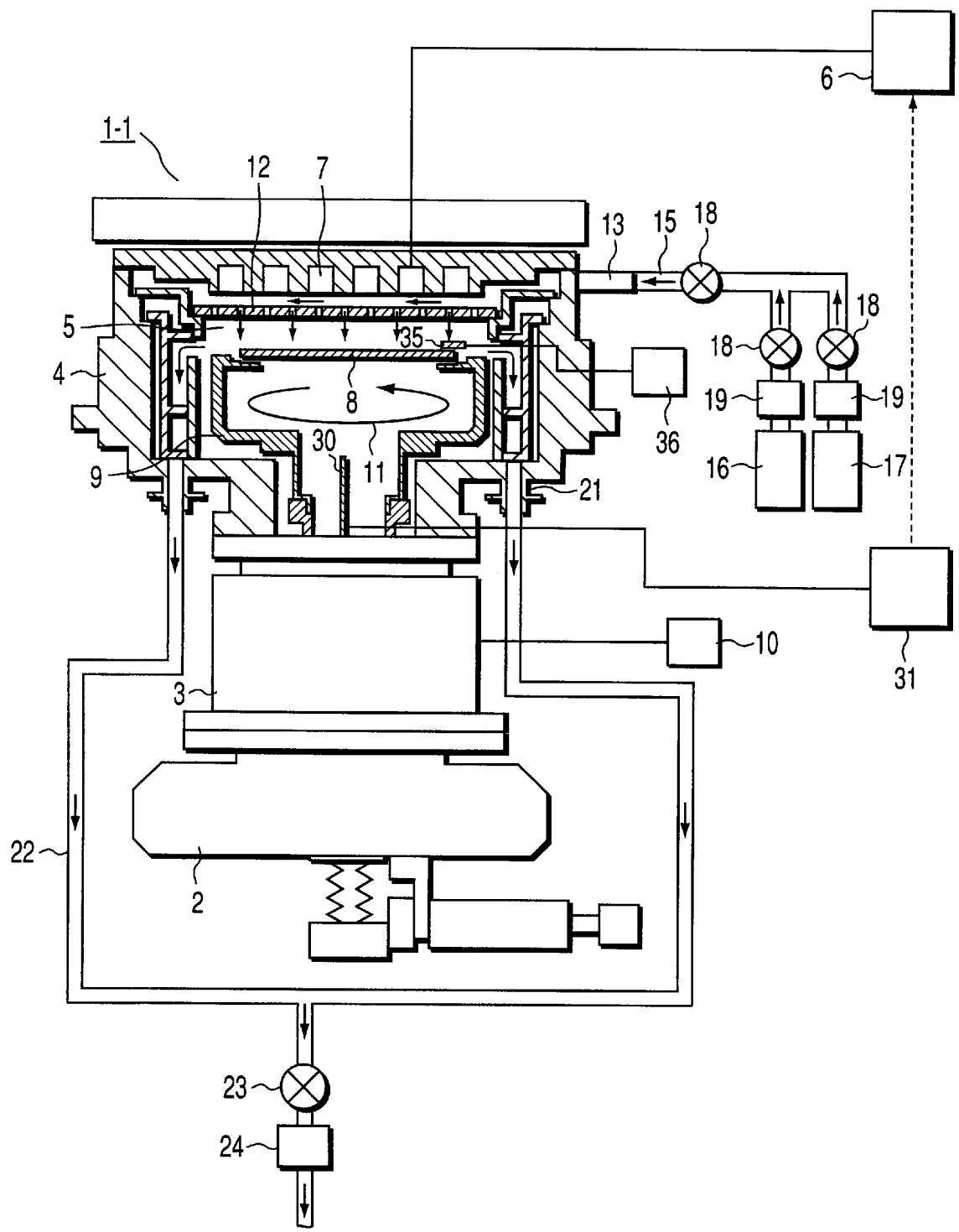
FIG. 1 shows an apparatus for manufacturing a semiconductor device according to the first embodiment of the present invention.

The present invention will now be described in detail with reference to the accompanying drawings. Throughout the drawings, the like members of the apparatus are denoted by the like reference numerals so as to avoid an overlapping description.

FIG. 1 shows an apparatus 1-1 for manufacturing a semiconductor device according to a first embodiment of the present invention. The manufacturing apparatus 1-1 shown in FIG. 1 is a cold wall type one-by-one lamp annealing apparatus.

In the apparatus 1-1, a process vessel 4 is arranged above a basement 2 with a rotating mechanism 3 interposed therebetween. A process chamber 5 is formed within the process vessel 4. Also, a plurality of light sources 7 each connected to a lamp power controller 6 are arranged in an upper portion within the process vessel 4. The light source 7 consists of, for example, a tungsten halogen lamp and is capable of heating a wafer 8, which is described herein later, at a predetermined heating rate, e.g., 100° C./sec or less.

A susceptor 9 for holding the wafer 8, i.e., a semiconductor substrate, is housed in the process vessel 4. The susceptor 9 is rotatably supported by the rotating mechanism 3 connected to a rotation control mechanism 10. The rotating mechanism 3 is capable of rotating the susceptor 9 at a rotating speed of, for example, 0 rpm to 10,000 rpm. The wafer 8 and the susceptor 9 are rotated in a direction denoted by an arrow 11.

A pyrometer 30, which is housed in the susceptor 9, is connected to a temperature measuring mechanism 31 so as to measure the temperature of the wafer 8. The temperature measuring mechanism 31 is connected to the lamp power controller 6, and the temperature data on the wafer 8 thus obtained is utilized for controlling the electric power supplied to the light source 7.

A shower head 12 is arranged in an upper portion of the process vessel 4. The shower head 12, which serves to supply uniformly an oxidizing gas and a nitriding gas onto a surface of the wafer 8 as described herein later, is, for example, a plate-like structure provided with a large number of holes.

An inlet port 13 is formed in an upper portion of the process vessel 4. An oxidizing gas source 16 and a nitriding gas source 17 are connected to the inlet port 1 via a pipe 15. A valve 18 and a flow meter 19 are mounted to the pipe 15 to make it possible to supply the oxidizing gas and the nitriding gas into the process chamber 5 at desired flow rates.

An outlet port 21, which is connected to a pipe 22, is formed in a lower portion of the process vessel 4. A pressure-control valve 23 and a pump 24 are mounted to the pipe 22 to make it possible to control the pressure in the process chamber 5 and to exhaust the gas within the process chamber 5 to the outside.

The apparatus 1-1 shown in FIG. 1 comprises a temperature measuring probe 35 arranged movable within the process chamber 5 in a vertical direction in the drawing and a temperature meter 36 connected to the probe 5. These probe 5 and temperature meter 36 serve to measure the gaseous phase temperature above the wafer 8 in order to set the process conditions.

Therefore, these probe 5 and the temperature meter 36 are unnecessary after the setting of the process conditions and, thus, are detached in general from the apparatus 1-1.

For manufacturing a semiconductor device, the apparatus 1-1 of the construction described above is operated as follows. In the first step, a silicon wafer as the semiconductor wafer 8 is introduced into the process vessel 4 so as to be disposed on the susceptor 9. Then, the wafer 8 is held by the susceptor, and the process chamber 5 is isolated from the outer atmosphere. Under this condition, the valve 23 is opened and the pump 24 is driven and then the valve 18 is opened so as to supply a mixed gas consisting of the oxidizing gas supplied from the oxidizing gas source 16 and the nitriding gas supplied from the nitriding gas source 17 into the process chamber 5. It is possible to use, for example, an oxygen gas ($O_2$) as the oxidizing gas. Also, the nitriding gas used in the present invention includes, for example, a nitrogen monoxide gas (NO).

While the mixed gas is being supplied into the process chamber 5, the susceptor 9 and the wafer 8 are rotated at, for example, 3000 rpm under the control by the rotation control mechanism 10. After the supply rate of the mixed gas and the rotating speed of the susceptor 9 are rendered constant, the wafer 8 is irradiated with light emitted from the plural light sources 7 while allowing the lamp power controller 6 to control the electric power supplied to these light sources 7 so as to rapidly heat the wafer 8. The temperature of the wafer 8 is measured by the pyrometer 30 and the temperature measuring mechanism 31. Based on the measured values, an electric power is supplied to the light sources 7 to control the heating rate of the wafer 8 at, for example, 50° C./sec.

When the temperature of the wafer 8 has reached a predetermined value, e.g., 1050° C., the predetermined value is maintained for, for example, 60 seconds. The predetermined temperature falls in general within a range of between 1000° C. and 1200° C.

Then, the power supplied to the light source 7 is decreased so as to rapidly decrease the wafer temperature. When the temperature of the wafer 8 is lowered to, for example, 200° C., the supply of the mixed gas and the rotation of the susceptor 9 are stopped so as to finish the process. By this method, it is possible to form, for example, an oxynitride film having a thickness of about 6 nm, which acts as a gate insulating film of a MOS transistor, on an element region of the wafer 8.

Figure 2:
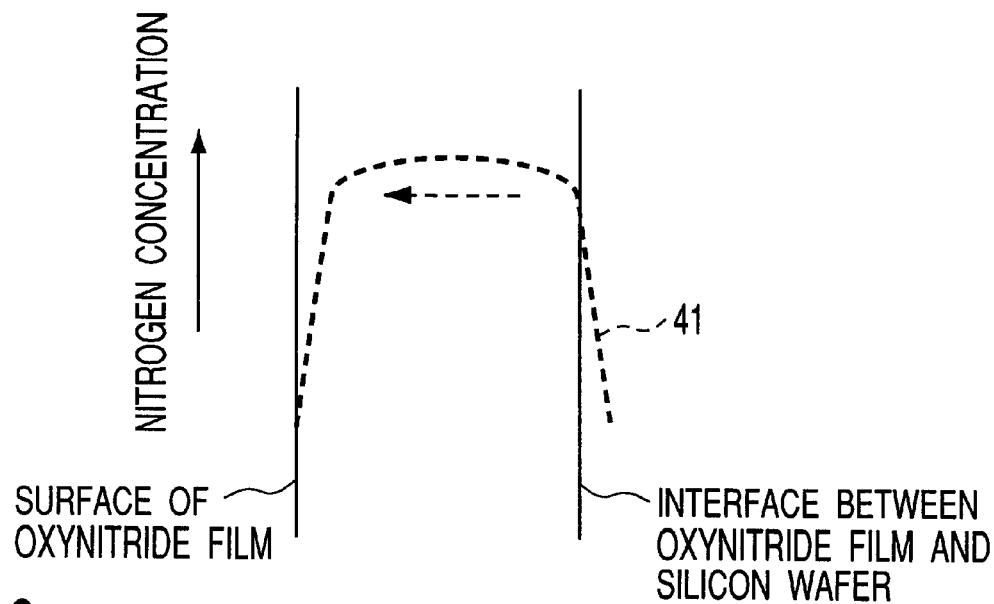
FIG. 2 is a graph schematically showing a nitrogen concentration distribution within an oxynitride film formed by a method according to the first embodiment of the present invention.

The distribution of the nitrogen concentration within the oxynitride film thus formed was examined, with the results as shown in FIG. 2. Specifically, FIG. 2 is a graph schematically showing the concentration distribution of the nitrogen atoms within an oxynitride film formed by a method according to a first embodiment of the present invention. A curve 41 in the graph represents the nitrogen concentration. FIG. 2 clearly shows that, where the oxynitride film is formed by the process of this embodiment, the nitrogen atoms are not localized in the vicinity of the interface between the silicon substrate and the oxynitride film, but are distributed substantially uniformly within the oxynitride film.

Figure 3:
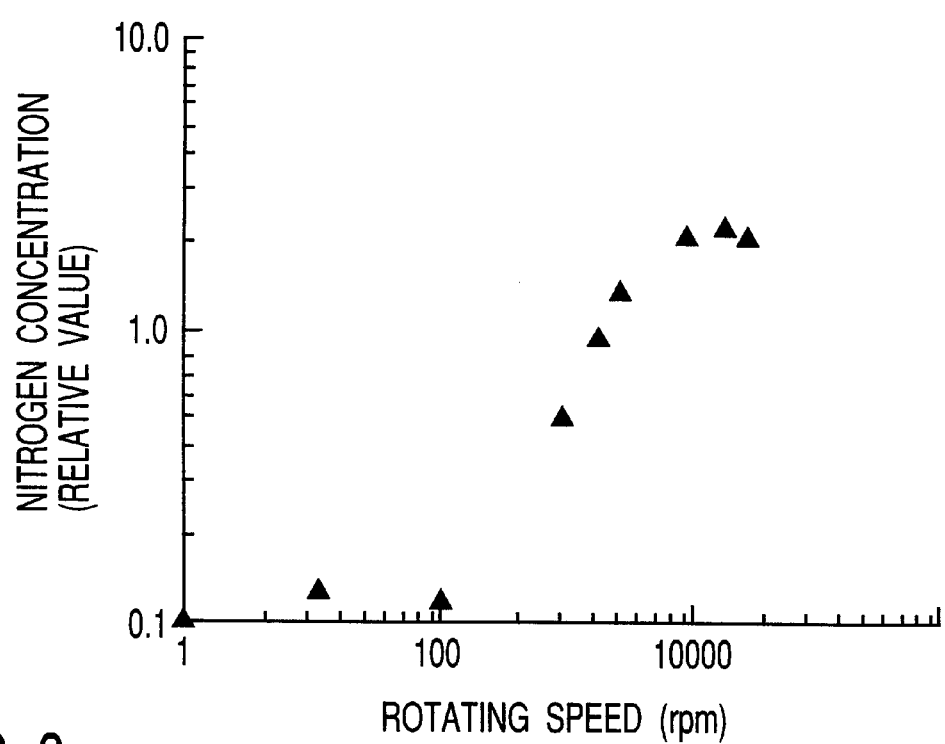
FIG. 3 is a graph schematically showing the relationship between the rotating speed of the wafer and the nitrogen concentration within an oxynitride film formed by the method according to the first embodiment of the present invention.

The nitrogen concentration within the oxynitride film formed by the method described above is changed with changes in the rotating speed of the susceptor 9 and the wafer 8 supported on the susceptor 9, as shown in FIG. 3.

Specifically, FIG. 3 is a graph showing the relationship between the rotating speed of the wafer 8 and the nitrogen concentration within the oxynitride film. In the graph of FIG. 3, the rotating speed of the wafer 8 is plotted on the abscissa, and the nitrogen concentration within the oxynitride film is plotted on the ordinate. The nitrogen concentration is plotted as a relative value based on the nitrogen concentration of a standard sample.

As shown in FIG. 3, where the rotating speed of the wafer 8 is lower than 100 rpm, the nitrogen concentration within the oxynitride film is very low and is substantially constant. Where the rotating speed of the wafer 8 exceeds 100 rpm, however, the nitrogen concentration is increased with increase in the rotating speed. In other words, it is possible to introduce nitrogen atoms into the oxynitride film in a desired concentration by setting the rotating speed of the wafer 8 to 100 rpm or higher.

The upper limit of the rotating speed of the wafer 8, which is not particularly specified in the present invention, should generally be about 10,000 rpm. Even if the rotating speed is set higher than the value given above, the nitrogen concentration is not prominently increased. It follows that it is desirable to set the rotating speed of the wafer 8 to fall within a range of between 100 rpm and 10,000 rpm.

The above-noted effect produced by the rotation of the wafer 8 is related to the gaseous phase temperature above the wafer 8. The reason for the particular relationship will now be described with reference to FIG. 4.

Figure 4:
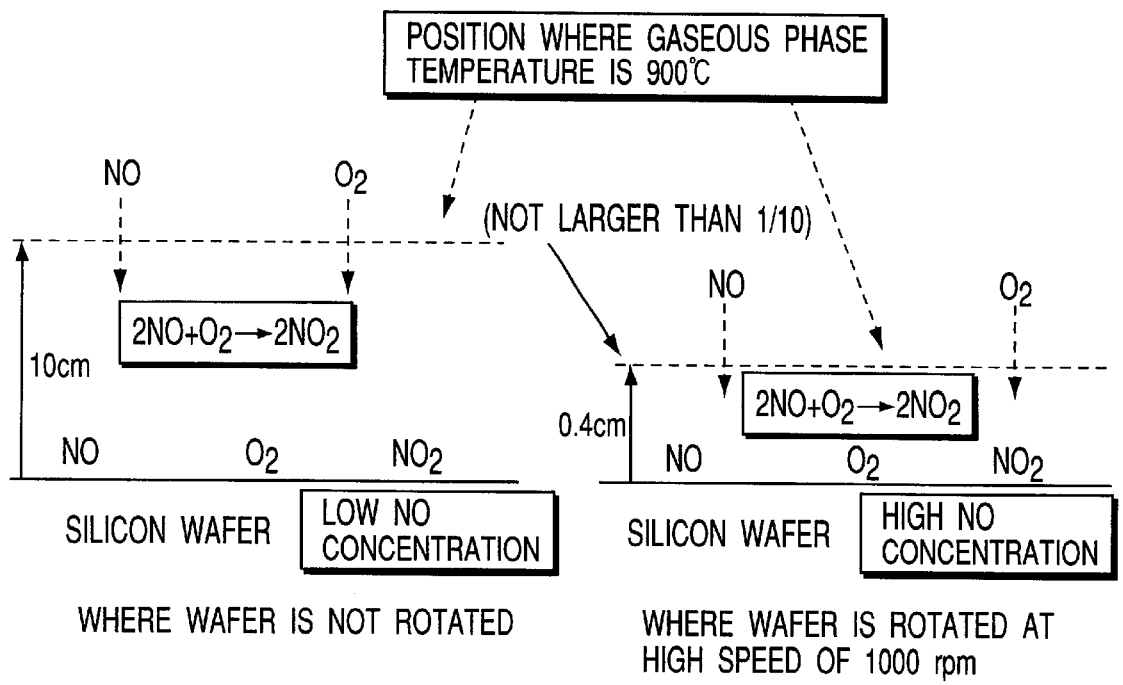
FIG. 4 schematically shows the gaseous state within a process chamber included in an apparatus for manufacturing a semiconductor device according to the first embodiment of the present invention.

Specifically, FIG. 4 schematically shows the state of the gaseous phase within the process chamber 5 included in the apparatus 1-1 according to the first embodiment of the present invention. In general, the reaction between an NO gas and an $O_2$ gas given below vigorously proceeds at temperatures not lower than 900° C.:

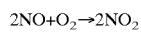

As shown in FIG. 4, where the wafer 8 is heated to 1000° C. and the wafer 8 is not rotated, a region of the gaseous phase having a temperature of 900° C. or higher, in which a gaseous phase reaction between an NO gas and an $O_2$ gas proceeds vigorously, reaches a plane that is 10 cm away from the surface of the wafer 8. On the other hand, where the wafer 8 is rotated at a speed of 1000 rpm, a region of the gaseous phase having a temperature of 900° C. or higher reaches a plane that is only 0.4 cm away from the surface of the wafer 8. In other words, where the wafer 8 is rotated at a speed of 1000 rpm, the thickness of the gaseous phase region having a temperature of 900° C. or higher is decreased to 1/10 or less of the case where the wafer 8 is not rotated.

As described above, the gaseous phase reaction between an NO gas and an $O_2$ gas can be controlled by rotating the wafer 8. To be more specific, a sufficiently large amount of NO gas can be kept supplied to the surface of the wafer 8 by rotating the wafer 8, making it possible to form an oxynitride film having nitrogen atoms contained therein uniformly and in a high concentration.

Figure 5:
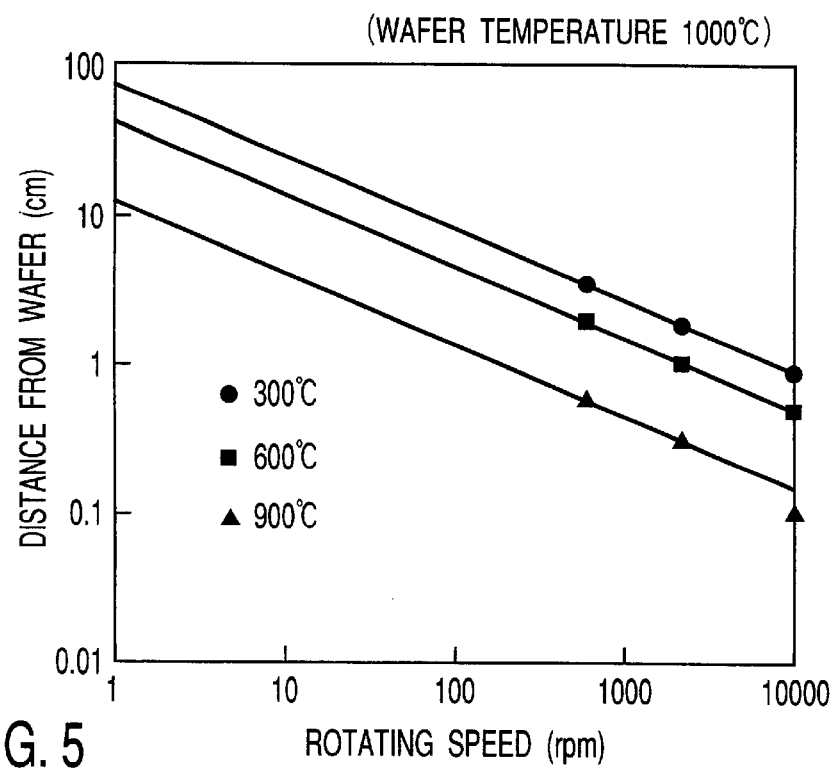
FIG. 5 is a graph showing the gaseous phase temperature observed within the process chamber included in an apparatus for manufacturing a semiconductor device according to the first embodiment of the present invention.

The thickness of a region of the gaseous phase having a temperature of 900° C. or higher, in which a gaseous phase reaction between an NO gas and an $O_2$ gas proceeds vigorously, is changed with changes in the rotating speed of the wafer 8, as apparent from FIG. 5 showing the relationship between the rotating speed of the wafer 8 and the temperature of the gaseous phase observed within the process chamber 5.

Specifically, FIG. 5 is a graph showing the temperature of the gaseous phase observed within the process chamber 5 included in the apparatus 1-1 according to the first embodiment of the present invention. In the graph of FIG. 5, the rotating speed of the wafer 8 is plotted on the abscissa, with the position, i.e., distance from the wafer 8, at which a predetermined temperature was observed being plotted on the ordinate.

As apparent from FIG. 5, the thickness of a region of the gaseous phase having a temperature of 900° C. or higher, in which a gaseous phase reaction between an NO gas and an $O_2$ gas proceeds vigorously, can be decreased by increasing the rotating speed of the wafer 8. Clearly, the experimental data given in FIGS. 3 and 5 fully support that the thickness of a region of the gaseous phase having a temperature of 900° C. or higher is very closely related to the nitrogen concentration within the oxynitride film.

The data given in FIG. 5 for each of the temperatures support that the gaseous phase temperature is lowered with increase in the distance from the wafer 8. For example, the point of 300° C. of the gaseous phase temperature is positioned above the point of 600° C. in the graph of FIG. 5, if the rotating speed of the wafer is set constant. And it is expected that the gaseous phase temperature may become constant at a predetermined point remote from the wafer 8. As a matter of fact, where the wafer 8 is rotated, a temperature gradient is formed in the gaseous phase temperature only near the wafer 8, and the gaseous phase temperature is substantially constant in the vicinity of the shower head 11.

Figure 6:
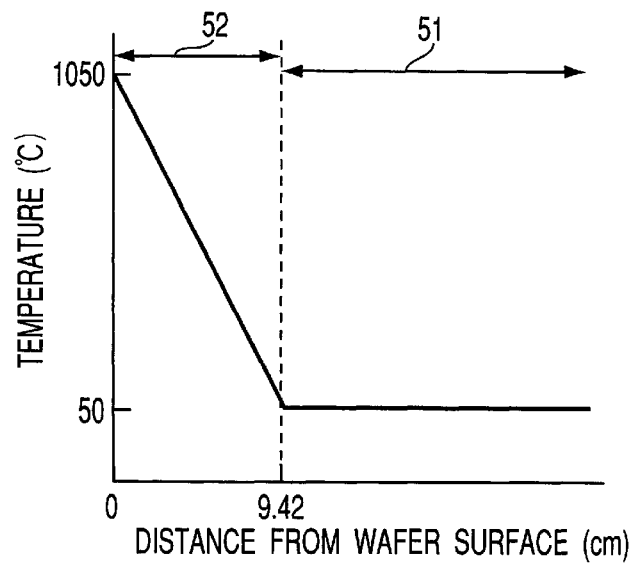
FIG. 6 is a graph showing the gaseous phase temperature observed within the process chamber included in an apparatus for manufacturing a semiconductor device according to the first embodiment of the present invention.

FIG. 6 is a graph showing the gaseous phase temperature observed within the process chamber 5 of the apparatus 1-1 according to the first embodiment of the present invention. In the graph of FIG. 6, the distance from the wafer 8 is plotted on the abscissa, with the gaseous phase temperature being plotted on the ordinate. The date given in FIG. 6 were obtained under the conditions that the wafer 8 was heated to 1050° C. and rotated at 100 rpm.

As shown in FIG. 6, the gaseous phase above the wafer 8 forms a first region 51 having a substantially uniform temperature and a second region 52 positioned between the first region 51 and the wafer 8. The temperature of the second region is gradually elevated from the interface between the first and second regions 51 and 52 toward the wafer 8 to form a temperature gradient. The temperature at the interface between the first and second regions 51 and 52 was about 50° C. and the thickness of the second region 52, i.e., the distance from the interface to the substrate, was 9.42 cm.

The thickness of the gaseous region having a temperature not lower than 900° C. is related to the thickness of the second region 52. Also, as already described in conjunction with FIG. 3, the nitrogen concentration within the oxynitride film can be increased by rotating the wafer 8 at a speed of at least 100 rpm. Therefore, the nitrogen concentration within the oxynitride film can be increased by controlling the thickness of the second region 52 at about 9.5 cm or by controlling the thickness of the gaseous phase region having a temperature of at least 900° C. at 1.5 cm or less. Of course, the nitrogen concentration can be increased by controlling both the thickness of the second region 52 and the thickness of the gaseous phase region having a temperature of at least 900° C. Incidentally, it is desirable to set the thickness of the gaseous phase region having a temperature of at least 900° C. at 1 cm or less. In this case, a sufficiently large amount of nitrogen can be introduced in to the oxynitride film.

Figure 7:
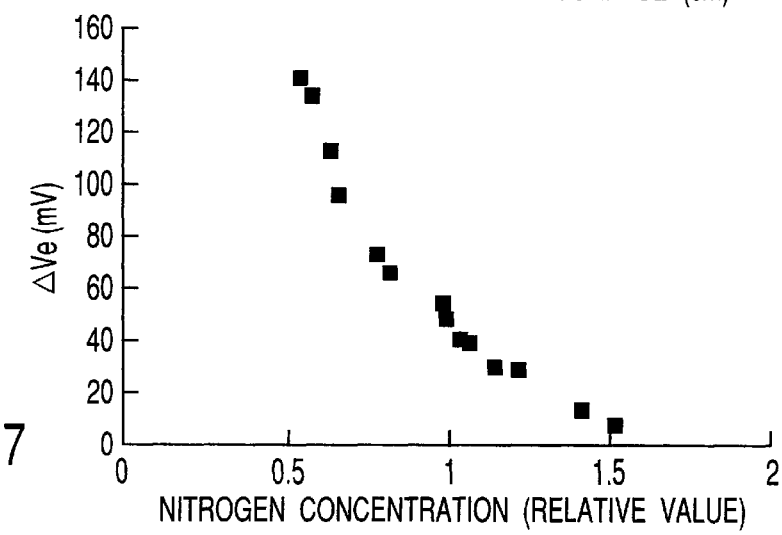
FIG. 7 is a graph showing the relationship between the nitrogen concentration in the oxynitride film formed by an apparatus for manufacturing a semiconductor device according to the first embodiment of the present invention and the electric characteristics.

Then, a plurality of oxynitride films were formed by changing the rotating speed of the wafer 8 so as to examine the relationship between the nitrogen concentration within the oxynitride film and the generation of the electron t raps caused by application of a predetermined stress to the oxynitride film. FIG. 7 shows the results.

Specifically, FIG. 7 is a graph showing the relationship between the nitrogen concentration within the oxynitride film formed by using the apparatus 1-1 according to the first embodiment of the present invention and the electric characteristics of the oxynitride film. In the graph of FIG. 7, the nitrogen concentration within the oxynitride film is plotted on the abscissa, with the occurrence of electron traps being plotted on the ordinate. In this graph, the nitrogen concentration is denoted by relative values.

As shown in FIG. 7, the occurrence of electron traps can be decreased by increasing the nitrogen concentration within the oxynitride film. In other words, an oxynitride film, in which the electron trap generation can be suppressed in the step of stress application, can be formed by suitably controlling the rotating speed of the wafer 8.

Figure 8:
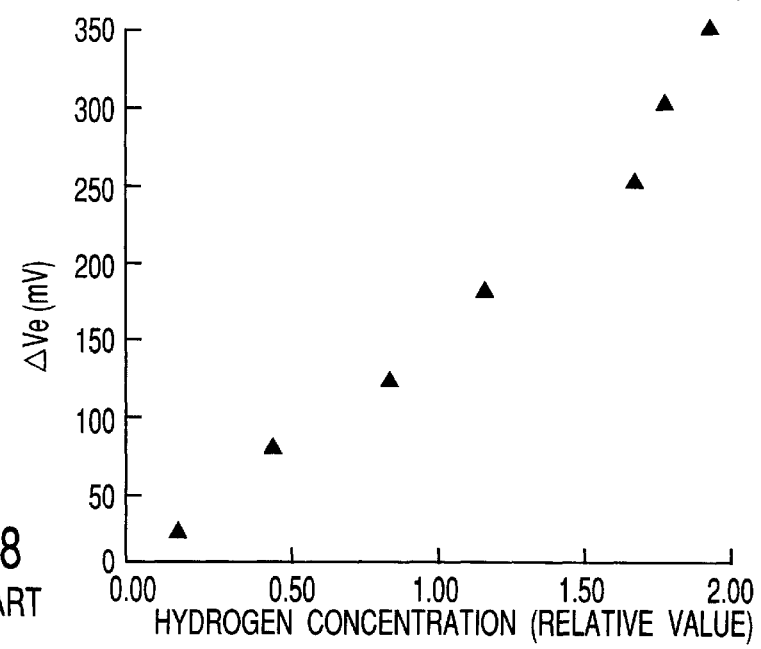
FIG. 8 is a graph showing the relationship between the hydrogen concentration in the oxynitride film formed by a conventional process and the electric characteristics.

The relationship between the hydrogen concentration within the oxynitride film and the electron trap generation has also bee examined. Specifically, an oxynitride film was formed by nitriding a silicon oxide film with use of an ammonia ($NH_3$) gas and subsequently annealing the film with use of an oxygen gas. Then, a plurality of oxynitride films differing in hydrogen concentration were formed by changing the annealing condition so as to examine the electron trap generation that took place in the step of applying a predetermined stress. FIG. 8 shows the results.

Specifically, FIG. 8 is a graph showing the relationship between the hydrogen concentration of the oxynitride film formed by conventional method and the electric characteristics of the oxynitride film. In the graph of FIG. 8, the hydrogen concentration within the oxynitride film is plotted on the abscissa, with the electron trap occurrence being plotted on the ordinate. Incidentally, the hydrogen concentration is plotted as relative values in FIG. 8.

As apparent from FIG. 8, the electron trap generation is increased with increase in the hydrogen concentration within the oxynitride film. According to the method of this embodiment, it is possible to use a gaseous compound that does not contain hydrogen such as $O_2$ or NO to each of the oxidizing gas and the nitriding gas. It follows that the method of the present invention makes it possible to form an oxynitride film having a hydrogen concentration much lower than the values plotted in FIG. 8.

In the first embodiment described above, the wafer 8 was rotated for forming an oxynitride film uniformly containing a high concentration of nitrogen. However, it is also possible to employ another technique. In a second embodiment described in the following, a mixed gas is supplied at a high flow rate in a direction parallel to the main surface of the wafer 8 so as to form an oxynitride film uniformly containing a high concentration of nitrogen.

Figure 9:
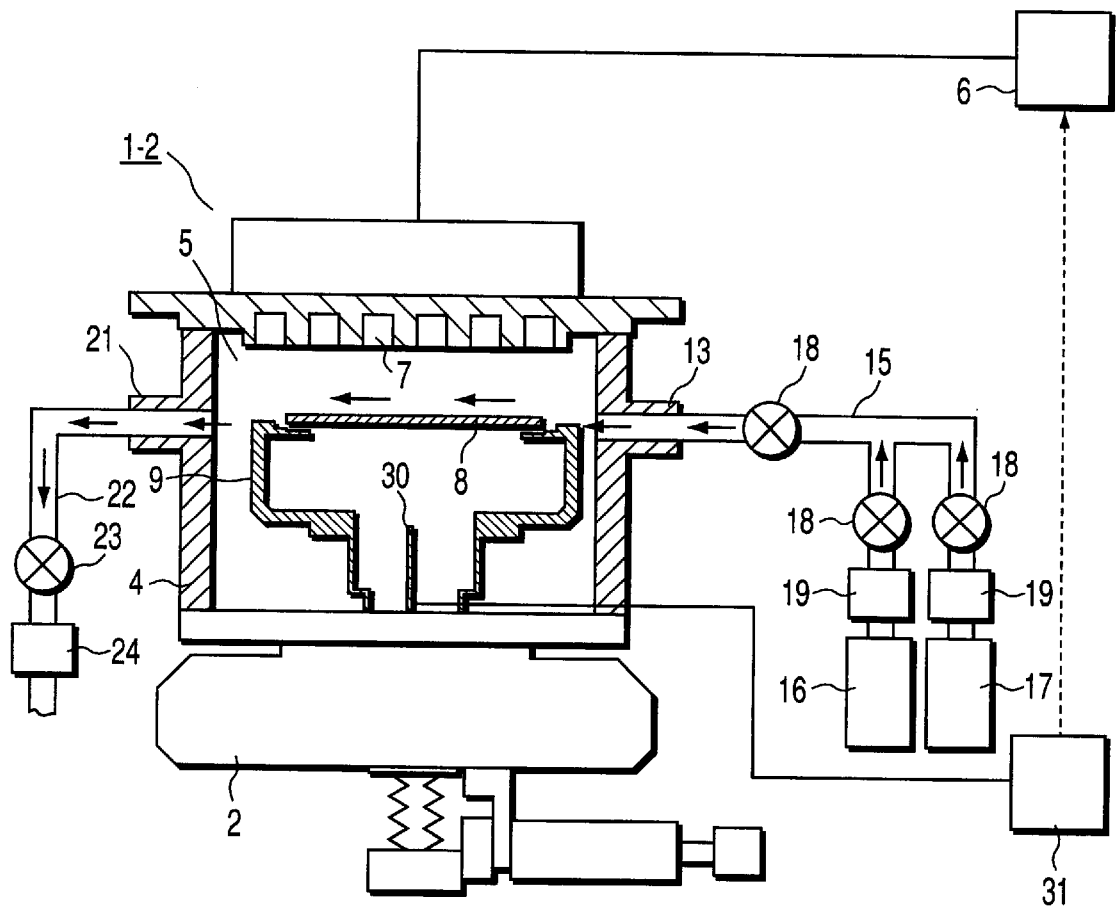
FIG. 9 shows an apparatus for manufacturing a semiconductor device according to a second embodiment of the present invention.

FIG. 9 shows an apparatus 1-2 for manufacturing a semiconductor device according to the second embodiment of the present invention. The manufacturing apparatus 1-2 shown in FIG. 9 is a cold wall type one-by-one lamp annealing apparatus.

The apparatus 1-2 comprises the process vessel 4 arranged above the basement 2. The process chamber 5 is formed within the process vessel 4, and a plurality of light sources 7 each connected to the lamp power controller 6 are arranged in an upper portion of the process vessel 4.

The susceptor 9 for holding the wafer 8 is housed in the process vessel 4. It should be noted that the apparatus 1-2 differs from the apparatus 1-1 according to the first embodiment of the present invention in that the susceptor 9 is not arranged rotatable. The pyrometer 30 is housed within the susceptor 9, and the temperature of the wafer 8 can be measured by the temperature measuring mechanism 31 connected to the pyrometer 30. The temperature measuring mechanism 31 is connected to the lamp power controller 6, and the obtained temperature data of wafer 8 are utilized for controlling the electric power supplied to the light source 7.

The inlet port 13 and the outlet port 21 are arranged substantially flush with the wafer 8 within the process vessel 4 in a manner to have the wafer 8 sandwiched therebetween. The oxidizing gas source 16 and the nitriding gas source 17 are connected to the inlet port 13 via the pipe 15. The valve 18 and the flow meter 19 are mounted to the pipe 15 to make it possible to supply into the process chamber 5 the oxidizing gas and the nitriding gas at desired flow rates. On the other hand, the pipe 22 is connected to the outlet port 21. The pressure-control valve 23 and the pump 24 are mounted to the pipe 22 to make it possible to exhaust the gas within the process chamber 5 to the outside.

The apparatus 1-2 of the construction described above is operated as follows for manufacturing a semiconductor device. In the first step, the wafer 8 is transferred into the process vessel 4 so as to be disposed on the susceptor 9. Then, the wafer 8 is held by the susceptor 8 and the process chamber 5 is isolated from the outer atmosphere. Under this condition, the valve 23 is opened and the pump 24 is driven and the then valve 18 is opened so as to supply a mixed gas consisting of the oxidizing gas supplied from the oxidizing gas source 16 and the nitriding gas supplied from the nitriding gas source 17 into the process chamber 5. In this step, the mixed gas is supplied at a high flow rate, e.g., about 3140 cm/sec or higher.

After the flow rate of the mixed gas has become constant, the wafer 8 is irradiated with light emitted from the plural light sources 7 while controlling the electric power supplied to these light sources 7 by the lamp power controller. The temperature of the wafer 8 is measured by the pyrometer 30 and the temperature measuring mechanism 31. Based on the measurement, the lamp power controller 6 controls the electric power supplied to the light source 7 so as to set the temperature elevation rate of the wafer 8 at a predetermined value.

When the temperature of the wafer 8 has reached the predetermined value, the predetermined temperature is maintained for a predetermined period of time. Then, the electric power supplied to the light source 7 is decreased so as to rapidly cool the wafer 8. When the wafer 8 has been cooled sufficiently, the supply of the mixed gas is stopped to finish the process. It is possible to form a satisfactory oxynitride film by this method.

The conditions for forming the oxynitride film by using the apparatus 1-2 were examined by the methods similar to those employed in the first embodiment. It has been found that the thickness of the second region 52 shown in FIG. 6 can be controlled at 9.5 cm or less by controlling the mixed gas flow rate at $1.05 \times 10^2$ cm/sec or more. It has also been found that the thickness of the gaseous phase having a temperature of 900° C. or higher can be controlled at 1.5 cm or less so as to increase the nitrogen concentration within the oxynitride film. Further, it has been found that an oxynitride film containing nitrogen atoms substantially uniformly can be obtained by the method of the second embodiment.

As described above, an undesired gaseous phase reaction between an oxidizing gas and a nitriding gas can be suppressed in the present invention by decreasing the thickness of a high temperature gas layer formed above a target substrate to be treated. Therefore, a sufficiently large amount of a nitriding gas can be kept supplied onto the surface of the substrate. It follows that the present invention makes it possible to form an oxynitride film uniformly containing a high concentration of nitrogen.

It should also be noted that, in the present invention, an oxynitride film containing a high concentration of nitrogen can be obtained without using a raw material compound containing hydrogen. Naturally, the oxynitride film obtained in the present invention contains a high concentration of nitrogen and scarcely contains hydrogen. It follows that, if the oxynitride film of the present invention is used as a tunnel insulating film, a high reliability can be realized.

In other words, the present invention makes it possible to manufacture a semiconductor device including a gate insulating film excellent in electric characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the step of:
   supplying an oxidizing gas and a nitriding gas onto one main surface of a semiconductor substrate while heating the substrate so as to oxynitride the surface region of the substrate;
   wherein said supplying step is performed such that the gaseous phase above the main surface of the substrate forms a first region having a substantially uniform temperature in a direction perpendicular to the main surface of the substrate and a second region interposed between the first region and the substrate and having a temperature gradient in a direction perpendicular to the main surface of the substrate such that the temperature is elevated toward the substrate;

and the distance from the main surface of the substrate to the interface between the first and second regions is set at 9.5 cm or less.

2. A method according to claim 1, wherein said substrate is a silicon substrate.

3. A method according to claim 1, wherein said substrate is heated by light irradiation.

4. A method according to claim 1, wherein said supplying step is performed such that the temperature of said gaseous phase is 900° C. or lower at a point 1.5 cm away from the main surface of said substrate.

5. A method according to claim 1, wherein said supplying step is performed while heating said substrate to 1000° C. or higher.

6. A method according to claim 5, wherein said supplying step is performed such that the temperature of said gaseous phase is 900° C. or lower at a point 1.5 cm away from the main surface of said substrate.

7. A method according to claim 1, wherein said oxidizing gas is an oxygen gas and said nitriding gas is a nitrogen monoxide gas.

8. A method according to claim 1, wherein said oxidizing gas and said nitriding gas are supplied in the form of a mixed gas thereof onto said main surface of the substrate.

9. A method according to claim 1, wherein said supplying step is performed while rotating said substrate.

10. A method according to claim 9, wherein said substrate is rotated at a speed of at least 100 rpm.

11. A method according to claim 1, wherein said oxidizing gas and said nitriding gas are supplied in the form of a mixed gas thereof in a direction parallel to one surface of said substrate.

12. A method according to claim 11, wherein the flow rate of said mixed gas is set at $1.05 \times 10^{20}$ cm/sec or higher.

* * * * *